(12) United States Patent
Xiao

(10) Patent No.: US 9,390,674 B2
(45) Date of Patent: *Jul. 12, 2016

(54) GOA CIRCUIT BASED ON LTPS SEMICONDUCTOR TFT

(71) Applicant: Shenzhen China Star Optoelectronics Technology Co., Ltd., Shenzhen, Guangdong (CN)

(72) Inventor: Juncheng Xiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 43 days.

This patent is subject to a terminal disclaimer.

(21) Appl. No.: 14/422,695

(22) PCT Filed: Feb. 6, 2015

(86) PCT No.: PCT/CN2015/072356
§ 371 (c)(1),
(2) Date: Feb. 19, 2015

(87) PCT Pub. No.: WO2016/070511
PCT Pub. Date: May 12, 2016

(65) Prior Publication Data
US 2016/0125830 A1    May 5, 2016

(30) Foreign Application Priority Data

Nov. 3, 2014    (CN) .......................... 2014 1 0613637

(51) Int. Cl.
*G09G 3/36*        (2006.01)
(52) U.S. Cl.
CPC ............ *G09G 3/3696* (2013.01); *G09G 3/3648* (2013.01); *G09G 2300/0426* (2013.01); *G09G 2300/0478* (2013.01); *G09G 2310/0289* (2013.01)

(58) Field of Classification Search
CPC ................... G09G 2310/0286; G09G 3/3677; G09G 2300/0408; G09G 3/3648; G09G 3/3674; G09G 3/3696; G09G 2300/0426; G09G 3/3266; G09G 2310/0267
USPC ..................... 345/92, 99, 100, 87; 377/64, 54
See application file for complete search history.

(56) References Cited

U.S. PATENT DOCUMENTS

| 2010/0260312 A1* | 10/2010 | Tsai ...................... G09G 3/3677 377/79 |
| 2012/0153996 A1* | 6/2012 | Su ......................... G09G 3/3659 327/109 |
| 2013/0135284 A1* | 5/2013 | Tseng .................... G11C 19/28 345/212 |

*Primary Examiner* — Koosha Sharifi-Tafreshi
(74) *Attorney, Agent, or Firm* — Andrew C. Cheng

(57) ABSTRACT

The present invention provides a GOA circuit based on LTPS semiconductor TFT, comprising a plurality of GOA units which are cascade connected, and N is set to be a positive integer and an Nth GOA unit comprises a pull-up control part (100), a pull-up part (200), a first pull-down part (400), a pull-down holding part (500) and a transfer part (600); the pull-down holding part (500) utilizes a high/low voltage reverse design and comprises a first, a second and a third DC constant low voltage levels (VSS1, VSS2, VSS3) which are sequentially abated and a DC constant high voltage level (H), the influence of electrical property of the LTPS semiconductor TFT to the GOA driving circuit, and particularly the bad function due to the electric leakage issue can be solved; meanwhile, the existing issue that the second node voltage level the pull-down holding circuit part in the GOA circuit based on the LTPS semiconductor TFT cannot be at higher voltage level in the functioning period can be solved to effectively maintain the first node (Q(N)) and the output end (G(N)) at low voltage level.

9 Claims, 4 Drawing Sheets

GOA CIRCUIT BASED ON LTPS SEMICONDUCTOR TFT

FIELD OF THE INVENTION

The present invention relates to a display technology field, and more particularly to a GOA circuit based on LTPS semiconductor TFT.

BACKGROUND OF THE INVENTION

GOA (Gate Drive On Array) is to manufacture the gate driver on the array substrate by utilizing the Thin Film Transistor (TFT) liquid crystal display array process for achieving the driving method of scanning line by line.

Generally, the GOA circuit comprises a pull-up part, a pull-up controlling part, a transfer part, a pull-down part, a pull-down holding part and a boost part in charge of boosting voltage level. The boost part generally comprises a bootstrap capacitor.

The pull-up part is mainly in charge of outputting the inputted clock signal (Clock) to the gate of the thin film transistor as being the driving signals of the liquid crystal display. The pull-up control part is mainly in charge of activating the pull-up part, and is generally functioned by the signal transferred from the former GOA circuit. The pull-down part is mainly in charge of rapidly pulling down the scan signal (i.e. the voltage level of the gate of the thin film transistor) to be low voltage level after outputting the scanning signal. The pull-down holding circuit part is mainly in charge of maintaining the scanning signal and the signal of the pull-up part in an off state (i.e. the set negative voltage level). The boost part in mainly in charge of performing a second boost to the voltage level of the pull-up part for ensuring the normal output of the pull-up part.

With the development of the LTPS semiconductor TFT, the LTPS-TFT LCD also becomes the focus that people pay lots of attentions. Because the LTPS semiconductor has better order than amorphous silicon (a-Si) and the LTPS itself has extremely high carrier mobility which can be more than 100 times of the amorphous silicon semiconductor, which the GOA skill can be utilized to manufacture the gate driver on the TFT array substrate to achieve the objective of system integration and saving the space and the cost of the driving IC. However, in prior arts, only few developments are proceeded for focusing on the GOA circuit of LTPS semiconductor TFT. Particularly, many problems caused by the electrical property of the oxide thin film transistors themselves have to be overcome. For instance: threshold voltage is generally larger than 0V in the electrical property of the traditional amorphous silicon thin film transistor and the swing of the subthreshold range voltage is relatively larger than the electrical current. However, the threshold voltage of the LTPS semiconductor TFT is lower (about 0V in general) and the subthreshold range swing is smaller. Many elements may function in a state of closing to the threshold voltage or even higher than the threshold voltage when the GOA circuit is in off state. Accordingly, the design difficulty of a LTPS GOA circuit will be increased because of the electrical leakage and working current drift of the TFTs in the circuit. Many designs which are adaptable to the scan driving circuit for the amorphous silicon semiconductors cannot be easily applied to the line scan driving circuit of LTPS semiconductor. Some function issues will exist which can directly result in malfunction of the LTPS GOA circuit. Therefore, the influence of the LTPS semiconductor TFT properties to the GOA circuit has to be considered as designing the circuit.

SUMMARY OF THE INVENTION

An objective of the present invention is to provide a GOA circuit based on LTPS semiconductor TFT to solve the influence of electrical property of the LTPS semiconductor TFT to the GOA driving circuit, and particularly the bad function due to the electric leakage issue; the issue that the second node voltage level and the pull-down holding circuit part in the GOA circuit based on the LTPS semiconductor TFT cannot be at higher voltage level in the non-functioning period can be solved.

For realizing the aforesaid objective, the present invention provides a GOA circuit based on LTPS semiconductor TFT, comprising a plurality of GOA units which are cascade connected, and N is set to be a positive integer and an Nth GOA unit comprises a pull-up control part, a pull-up part, a first pull-down part, a pull-down holding part and a transfer part;

the pull-up control part comprises a first transistor, and a gate is electrically coupled to an driving output end of an N-1th GOA unit which is the former stage of the Nth GOA unit and a source is electrically coupled to an output end of an N-1th GOA unit which is the former stage of the Nth GOA unit, and a drain is electrically coupled to a first node;

the pull-up part comprises a second transistor, and a gate thereof is electrically coupled to the first node, and a source is electrically coupled to a first clock driving signal, and a drain is electrically coupled to an output end;

the pull-down holding part is electrically coupled to the first node, the output end, a DC constant high voltage level, and a first, a second and a third DC constant low voltage levels;

the pull-down holding part utilizes a high/low voltage reverse design and comprises:

a third transistor, and both a gate and a source of the third transistor are electrically coupled to the DC constant high voltage level, and a drain is electrically coupled to a source of a fifth transistor;

a fourth transistor, and a gate of the fourth transistor is electrically coupled to the drain of the third transistor, and a source is electrically coupled to the DC constant high voltage level, and a drain is electrically coupled to a second node;

the fifth transistor, and a gate of the fifth transistor is electrically coupled to the first node, and the source is electrically coupled to the drain of the third transistor, and a drain is electrically coupled to the first DC constant low voltage level;

a sixth transistor, and a gate of the sixth transistor is electrically coupled to the first node, and a source is electrically coupled to the second node, and a drain is electrically coupled to a source of an eighth transistor;

the eighth transistor, and the gate of the eighth transistor is electrically coupled to the first node, and the source is electrically coupled to the drain of the sixth transistor, and a drain is electrically coupled to the third DC constant low voltage level;

the tenth transistor, and the gate of the tenth transistor is electrically coupled to the second node and a source is electrically coupled to the DC constant high voltage level, and a drain is electrically coupled to the drain of the sixth transistor;

a twelfth transistor, and a gate of the twelfth transistor is electrically coupled to the second node, and a source is electrically coupled to the first node, and a drain is electrically coupled to the second DC constant low voltage level;

a thirteenth transistor, and a gate of the thirteenth transistor is electrically coupled to the second node, and a source is electrically coupled to the output end, and a drain is electrically coupled to the first DC constant low voltage level;

the third transistor, the fourth transistor, the fifth transistor, the sixth transistor provide positive high voltage levels, employed to control activations of the twelfth transistor and the thirteenth transistor; the eighth transistor constructs a reverse bootstrap of negative voltage level in a functioning period, employed to provide a lower voltage level to the second node in the functioning period; the DC constant high voltage level is utilized to provide a proper high voltage level to the second node in a non-functioning period to maintain the first node and the output end at low voltage level;

the first pull-down part is electrically coupled to the first node, a second clock driving signal and the second DC constant low voltage level, and the pull-down part pulls down a voltage level of the first node to the second DC constant low voltage level according to the second clock driving signal;

the first pull-down part comprises a fourteenth transistor, and a gate of the fourteenth transistor is electrically coupled to the second clock driving signal, and a source is electrically coupled to the first node, and a drain is electrically coupled to the second DC constant low voltage level;

the transfer part comprises a fifteenth transistor, and a gate of the fifteenth transistor is electrically coupled to the first node, and a source is electrically coupled to the first clock driving signal, and a drain is electrically coupled to a driving output end;

the third DC constant low voltage level<the second DC constant low voltage level<the first DC constant low voltage level.

The fourth transistor, the sixth transistor and the eighth transistor are coupled in series.

The GOA circuit based on LTPS semiconductor TFT further comprises a boost part, and the boost part is electrically coupled between the first node and the output end, employed to boost voltage level of the first node.

The boost part comprises a capacitor, and one end of the capacitor is electrically coupled to the first node, and the other end is electrically coupled to the output end.

Waveform duty ratios of the first clock driving signal and the second clock driving signal are smaller than 50/50; the fourteenth transistor pulls down the voltage level of the first node to the second DC constant low voltage level in a high voltage level period of the second clock driving signal.

A signal output waveform of the first node changes according to the variation of the waveform duty ratios of the first clock driving signal and the second clock driving signal.

The signal output waveform of the first node appears to be convex.

In the first level connection of the GOA circuit, both the gate and the drain of the first transistor are electrically coupled to an activation signal end of the circuit.

The benefits of the present invention are: in the GOA circuit based on LTPS semiconductor TFT, the pull-down holding part utilizes a high/low voltage reverse design and comprises a first, a second and a third DC constant low voltage levels which are sequentially abated and a DC constant high voltage level. The influence of electrical property of the LTPS semiconductor TFT to the GOA driving circuit, and particularly the bad function due to the electric leakage issue can be solved; meanwhile, the existing issue that the second node voltage level and the pull-down holding circuit part in the GOA circuit based on the LTPS semiconductor TFT cannot be at higher voltage level in the non-functioning period can be solved to effectively maintain the first node and the output end at low voltage level.

BRIEF DESCRIPTION OF THE DRAWINGS

For better explaining the technical solution and the effect of the present invention, the present invention will be further described in detail with the accompanying drawings in the specific embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
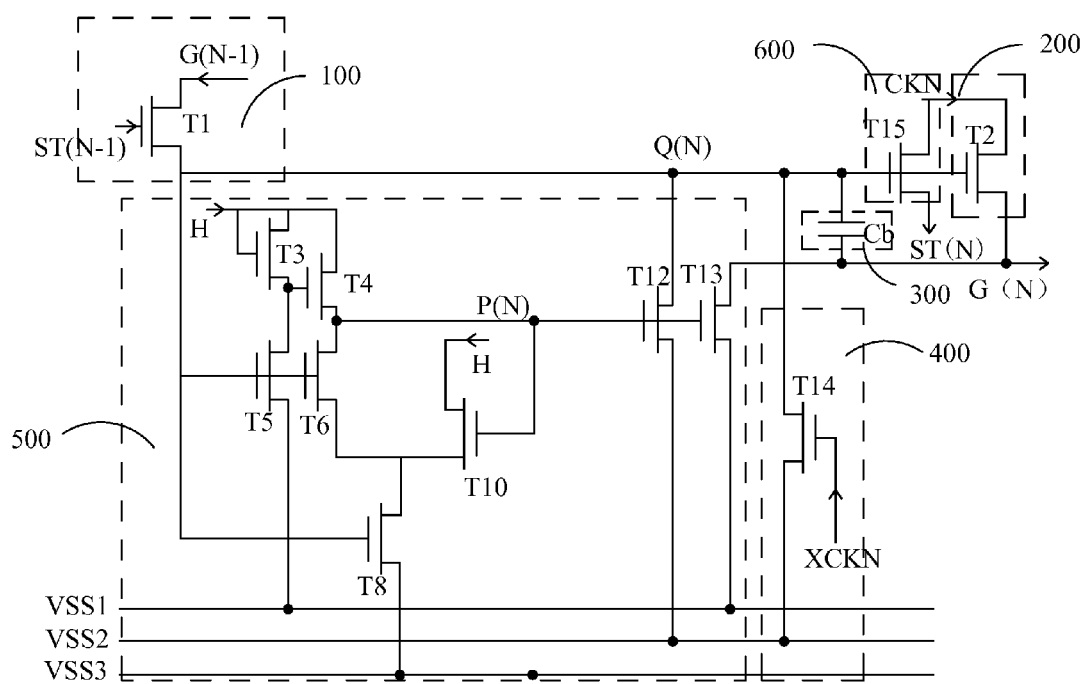
FIG. 1 is a circuit diagram of a GOA circuit based on LTPS semiconductor TFT according to the present invention.
Figure 2:
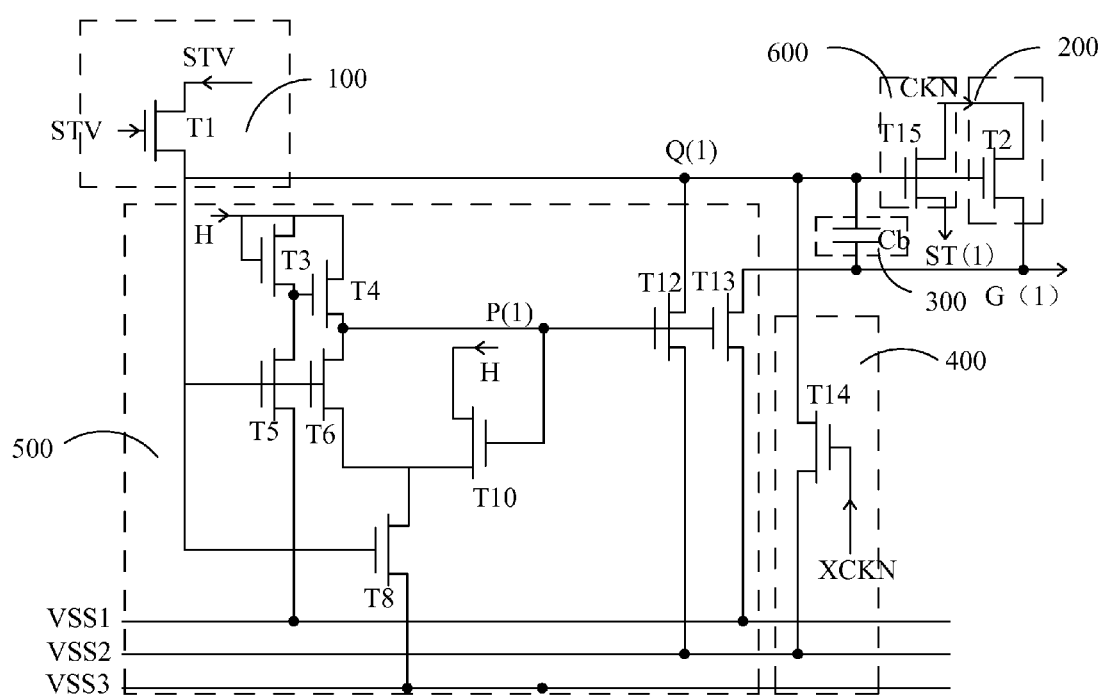
FIG. 2 is a circuit diagram of the first level connection of the GOA circuit based on LTPS semiconductor TFT according to the first embodiment of the present invention.

Please refer to FIGS. 1-2. The present invention provides a GOA circuit based on LTPS semiconductor TFT. As shown in FIG. 1, the GOA circuit based on LTPS semiconductor TFT comprises a plurality of GOA units which are cascade connected, and N is set to be a positive integer and an Nth GOA unit comprises a pull-up control part 100, a pull-up part 200, a first pull-down part 400, a pull-down holding part 500 and a transfer part 600; further a boost part 300.

The pull-up control part 100 comprises a first transistor T1, and a gate is electrically coupled to an driving output end ST(N−1) of an N−1th GOA unit which is the former stage of the Nth GOA unit and a source is electrically coupled to an output end G(N−1) of an N−1th GOA unit which is the former stage of the Nth GOA unit, and a drain is electrically coupled to a first node Q(N);

The pull-up part 200 comprises a second transistor T2, and a gate thereof is electrically coupled to the first node Q(N), and a source is electrically coupled to a first clock driving signal CKN, and a drain is electrically coupled to an output end G(N);

The boost part 300 comprises a capacitor Cb, and one end of the capacitor Cb is electrically coupled to the first node Q(N), and the other end is electrically coupled to the output end G(N).

The pull-down holding part 500 is electrically coupled to the first node Q(N), the output end G(N), a DC constant high voltage level H, and a first, a second and a third DC constant low voltage levels VSS1, VSS2, VSS3. Specifically, the pull-down holding part 500 comprises: a third transistor T3, and both a gate and a source of the third transistor T3 are electrically coupled to the DC constant high voltage level H, and a drain is electrically coupled to a source of a fifth transistor T5; a fourth transistor T4, and a gate of the fourth transistor T4 is electrically coupled to the drain of the third transistor T3, and a source is electrically coupled to the DC constant high voltage level H, and a drain is electrically coupled to a second node P(N); the fifth transistor T5, and a gate of the fifth transistor T5 is electrically coupled to the first node Q(N), and the source is electrically coupled to the drain of the third transistor T3, and a drain is electrically coupled to the first DC constant low voltage level VSS1; a sixth transistor T6, and a gate of the sixth transistor T6 is electrically coupled to the first node Q(N), and a source is electrically coupled to the second node P(N), and a drain is electrically coupled to a source of an eighth transistor T8; the eighth transistor T8, and the gate of the eighth transistor T8 is electrically coupled to the first node Q(N), and the source is electrically coupled to the drain of the sixth transistor T6, and a drain is electrically coupled to the third DC constant low voltage level VSS3; the tenth transistor T10, and the gate of the tenth transistor T10 is electrically coupled to the second node P(N) and a source is electrically coupled to the DC constant high voltage level H, and a drain is electrically coupled to the drain of the sixth transistor T6; a twelfth transistor T12, and a gate of the twelfth transistor T12 is electrically coupled to the second node P(N), and a source is electrically coupled to the first node Q(N), and a drain is electrically coupled to the second DC constant low voltage level VSS2; a thirteenth transistor T13, and a gate of the thirteenth transistor T13 is electrically coupled to the second node P(N), and a source is electrically coupled to the output end G(N), and a drain is electrically coupled to the first DC constant low voltage level VSS1.

The first pull-down part 400 comprises a fourteenth transistor T14, and a gate of the fourteenth transistor T14 is electrically coupled to the second clock driving signal XCKN, and a source is electrically coupled to the first node Q(N), and a drain is electrically coupled to the second DC constant low voltage level VSS2.

the transfer part 600 comprises a fifteenth transistor T15, and a gate of the fifteenth transistor T15 is electrically coupled to the first node Q(N), and a source is electrically coupled to the first clock driving signal CKN, and a drain is electrically coupled to a driving output end ST(N);

As shown in FIG. 2, in the first level connection of the GOA circuit, both the gate and the drain of the first transistor T1 are electrically coupled to an activation signal end STV of the circuit.

Specifically, the GOA circuit based on LTPS semiconductor TFT according to the present invention comprises a DC constant high voltage level H and three DC constant low voltage levels VSS1, VSS2, VSS3. The three DC constant low voltage levels VSS1, VSS2, VSS3 are sequentially abated, i.e. the third DC constant low voltage level<the second DC constant low voltage level<the first DC constant low voltage level. The three DC constant low voltage levels VSS1, VSS2, VSS3 are separately and independently controlled for conveniently performing adjustments of different voltage levels.

The pull-down holding part 500 utilizes a high/low voltage reverse design; the third transistor T3, the fourth transistor T4, the fifth transistor T5, the sixth transistor T6 provide positive high voltage levels, employed to control activations of the twelfth transistor T12 and the thirteenth transistor T13; the eighth transistor T8 constructs a reverse bootstrap of negative voltage level, employed to pull down the second node P(N) to the third DC constant low voltage level VSS3 in the functioning period; the DC constant high voltage level H is utilized to provide a proper high voltage level to the second node P(N) in a non-functioning period to maintain the first node Q(N) and the output end G(N) at low voltage level to eliminate the ripple of the two. The fourth transistor T4, the sixth transistor T6 and the eighth transistor T8 are coupled in series which is capable of preventing electrical leakage. With the aforesaid arrangement of the pull-down holding part 500, it is capable of reducing the amount of the TFTs and saving layout. Moreover, the gate of the tenth transistor T10 coupled to the second node P(N) can prevent the damage of the over high voltage level to the tenth transistor T10.

Specifically, the third transistor T3, the fourth transistor T4 of the pull-down holding part 500 is controlled by the DC constant high voltage level H to be in an activated state. In non-functioning period, the fifth transistor T5, the sixth transistor T6 are deactivated, and the fourth transistor T4 provides the DC constant high voltage level H to the second node P(N). When the second node P(N) is at high voltage level, both the twelfth transistor T12, the thirteenth transistor T13 are activated. The voltage level of the first node Q(N) is pulled down to the second DC constant low voltage level VSS2 by the twelfth transistor T12. The voltage level of the output end G(N) is pulled down to the first DC constant low voltage level VSS1 by the thirteenth transistor T13; in functioning period, the gates of the fifth transistor T5, the sixth transistor T6, the eighth transistor T8 are high voltage level transmitted from the first node Q(N), and all of the fifth transistor T5, the sixth transistor T6, the eighth transistor T8 are activated. The gate voltage of the fourth transistor T4 is pulled down to the first constant DC low voltage level VSS1 by the fifth transistor T5, and the fourth transistor T4 is deactivated and no longer provides the DC constant high voltage level H to the second node P(N). Now, both the sixth transistor T6 and the eighth transistor T8 are activated. The voltage level of the second node P(N) is pulled down to the third DC constant low voltage level VSS3 which is lower by the sixth transistor T6 and the eighth transistor T8.

With the pull-down holding part 500 in cooperation with the DC constant high voltage level H and three DC constant low voltage levels VSS1, VSS2, VSS3, the influence of electrical property of the LTPS semiconductor TFT to the GOA driving circuit, and particularly the bad function due to the electric leakage issue can be solved; meanwhile, the existing issue that the second node voltage level and the pull-down holding circuit part in the GOA circuit based on the LTPS semiconductor TFT cannot be at higher voltage level in the non-functioning period can be solved to effectively maintain the first node Q(N) and the output end G(N) at low voltage level.

The boost part 300 is employed to boost the voltage level of the first node Q(N) in functioning period.

The first pull-down part 400 is employed to pull down the voltage level of the first node Q(N) to the second DC constant low voltage level VSS2 according to the second clock driving signal XCKN in non-functioning period.

The GOA circuit employs an output signal of the driving output end ST(N) as being a former-latter level transfer signal. The driving output end ST(N−1) of the N−1th GOA unit which is the former stage of the Nth GOA unit and the driving output end ST(N) of the Nth GOA unit are employed for performing the former-latter level transfer which is capable of preventing the leakage of the first node Q(N). Moreover, with adding a solo transfer part 600, the RC delay of the output end G(N) can be weakened.

Figure 3:
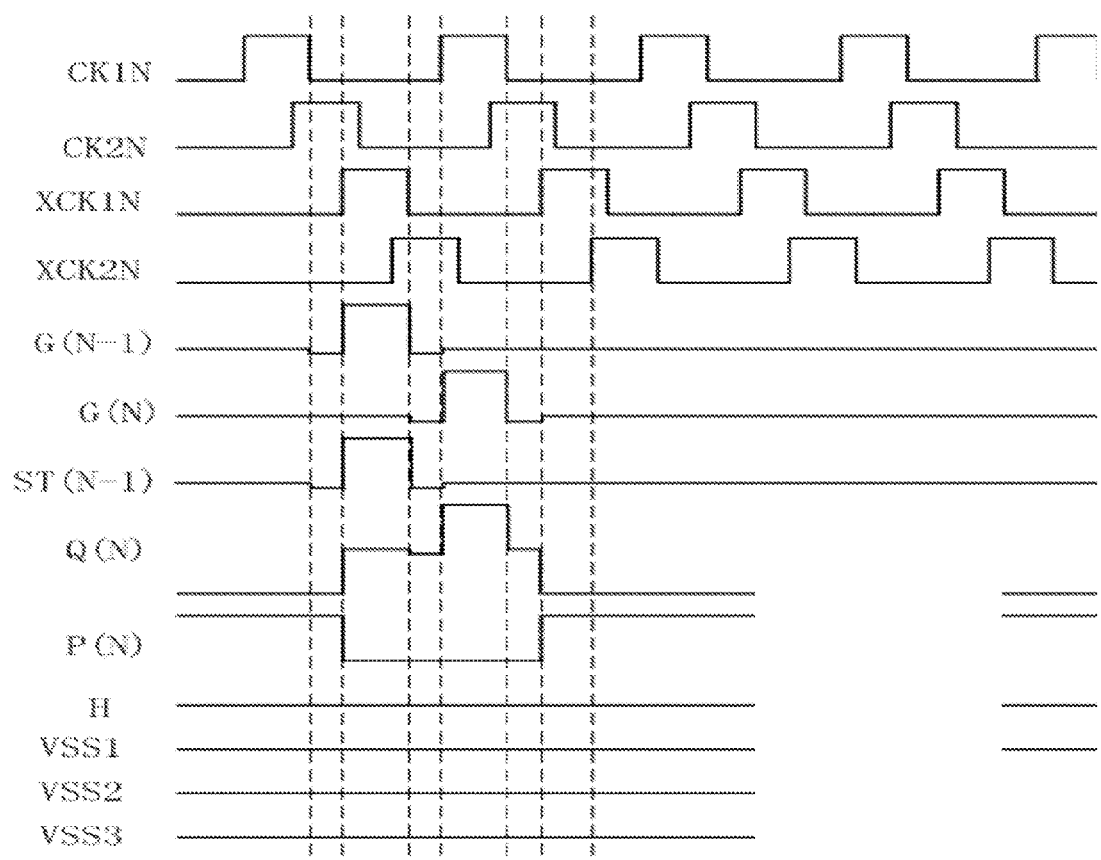
FIG. 3 is an output waveform diagram of the first waveform settings and the key nodes in a GOA circuit based on LTPS semiconductor TFT according to the present invention.
Figure 4:
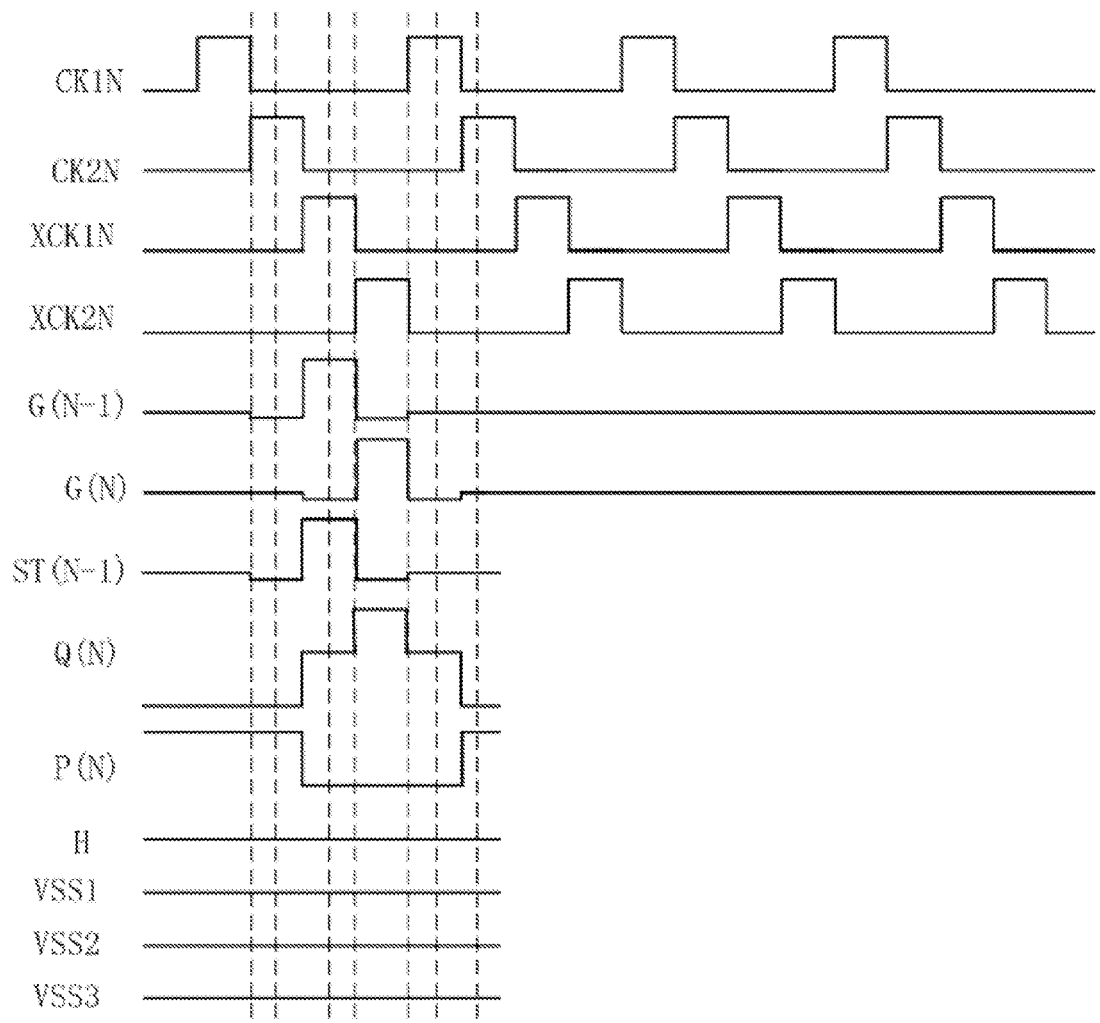
FIG. 4 is an output waveform diagram of the second waveform settings and the key nodes in a GOA circuit based on LTPS semiconductor TFT according to the present invention.

FIG. 3, FIG. 4 respectively are output waveform diagrams of two waveform settings and the key nodes in a GOA circuit based on LTPS semiconductor TFT according to the present invention. The signal output waveform of the first node Q(N) changes according to the variation of the waveform duty ratios of the first clock driving signal CKN and the second clock driving signal XCKN. The waveform duty ratios of the first clock driving signal CKN and the second clock driving signal XCKN shown in FIG. 3 are different from the waveform duty ratios of the first clock driving signal CKN and the second clock driving signal XCKN shown in FIG. 4. In FIG. 3 and FIG. 4, CK1N, CK2N respectively represent a first line, a second line of the first clock driving signals CKN. XCK1N, XCK2N respectively represent a first line, a second line of the second clock driving signals XCKN. As shown in figures, all the waveform duty ratios of the first clock driving signals CKN and the second clock driving signals XCKN are smaller than 50/50; in combination with FIG. 1, the fourteenth transistor T14 pulls down the voltage level of the first node Q(N) to the second DC constant low voltage level VSS2 in a high voltage level period of the second clock driving signal XCKN. The signal output waveform of the first node Q(N) appears to be convex, and the output end G(N) normally outputs.

In conclusion, in the GOA circuit based on LTPS semiconductor TFT, the pull-down holding part utilizes a high/low voltage reverse design and comprises a first, a second and a third DC constant low voltage levels which are sequentially abated and a DC constant high voltage level. The influence of electrical property of the LTPS semiconductor TFT to the GOA driving circuit, and particularly the bad function due to the electric leakage issue can be solved; meanwhile, the existing issue that the second node voltage level and the pull-down holding circuit part in the GOA circuit based on the LTPS semiconductor TFT cannot be at higher voltage level in the non-functioning period can be solved to effectively maintain the first node and the output end at low voltage level.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit based on LTPS semiconductor TFT, comprising a plurality of GOA units which are cascade connected, and N is set to be a positive integer and an Nth GOA unit comprises a pull-up control part, a pull-up part, a first pull-down part, a pull-down holding part and a transfer part;
    the pull-up control part comprises a first transistor, and a gate is electrically coupled to an driving output end of an N−1th GOA unit which is the former stage of the Nth GOA unit and a source is electrically coupled to an output end of an N−1th GOA unit which is the former stage of the Nth GOA unit, and a drain is electrically coupled to a first node;
    the pull-up part comprises a second transistor, and a gate thereof is electrically coupled to the first node, and a source is electrically coupled to a first clock driving signal, and a drain is electrically coupled to an output end;
    the pull-down holding part is electrically coupled to the first node, the output end, a DC constant high voltage level, and a first, a second and a third DC constant low voltage levels;
    the pull-down holding part utilizes a high/low voltage reverse design and comprises:
    a third transistor, and both a gate and a source of the third transistor are electrically coupled to the DC constant high voltage level, and a drain is electrically coupled to a source of a fifth transistor;
    a fourth transistor, and a gate of the fourth transistor is electrically coupled to the drain of the third transistor, and a source is electrically coupled to the DC constant high voltage level, and a drain is electrically coupled to a second node;
    the fifth transistor, and a gate of the fifth transistor is electrically coupled to the first node, and the source is electrically coupled to the drain of the third transistor, and a drain is electrically coupled to the first DC constant low voltage level;
    a sixth transistor, and a gate of the sixth transistor is electrically coupled to the first node, and a source is electrically coupled to the second node, and a drain is electrically coupled to a source of an eighth transistor;
    the eighth transistor, and the gate of the eighth transistor is electrically coupled to the first node, and the source is electrically coupled to the drain of the sixth transistor, and a drain is electrically coupled to the third DC constant low voltage level;
    the tenth transistor, and the gate of the tenth transistor is electrically coupled to the second node and a source is electrically coupled to the DC constant high voltage level, and a drain is electrically coupled to the drain of the sixth transistor;
    a twelfth transistor, and a gate of the twelfth transistor is electrically coupled to the second node, and a source is electrically coupled to the first node, and a drain is electrically coupled to the second DC constant low voltage level;
    a thirteenth transistor, and a gate of the thirteenth transistor is electrically coupled to the second node, and a source is electrically coupled to the output end, and a drain is electrically coupled to the first DC constant low voltage level;
    the third transistor, the fourth transistor, the fifth transistor, the sixth transistor provide positive high voltage levels, employed to control activations of the twelfth transistor and the thirteenth transistor; the eighth transistor constructs a reverse bootstrap of negative voltage level in a functioning period, employed to provide a lower voltage level to the second node in the functioning period; the DC constant high voltage level is utilized to provide a proper high voltage level to the second node in a non-functioning period to maintain the first node and the output end at low voltage level;
    the first pull-down part is electrically coupled to the first node, a second clock driving signal and the second DC constant low voltage level, and the pull-down part pulls down a voltage level of the first node to the second DC constant low voltage level according to the second clock driving signal;
    the first pull-down part comprises a fourteenth transistor, and a gate of the fourteenth transistor is electrically coupled to the second clock driving signal, and a source is electrically coupled to the first node, and a drain is electrically coupled to the second DC constant low voltage level;
    the transfer part comprises a fifteenth transistor, and a gate of the fifteenth transistor is electrically coupled to the first node, and a source is electrically coupled to the first clock driving signal, and a drain is electrically coupled to a driving output end;
    the third DC constant low voltage level<the second DC constant low voltage level<the first DC constant low voltage level.

2. The GOA circuit based on LTPS semiconductor TFT according to claim 1, wherein the fourth transistor, the sixth transistor and the eighth transistor are coupled in series.

3. The GOA circuit based on LTPS semiconductor TFT according to claim 1, further comprises a boost part, and the boost part is electrically coupled between the first node and the output end, employed to boost voltage level of the first node.

4. The GOA circuit based on LTPS semiconductor TFT according to claim 3, wherein the boost part comprises a capacitor, and one end of the capacitor is electrically coupled to the first node, and the other end is electrically coupled to the output end.

5. The GOA circuit based on LTPS semiconductor TFT according to claim 1, wherein waveform duty ratios of the first clock driving signal and the second clock driving signal are smaller than 50/50; the fourteenth transistor pulls down the voltage level of the first node to the second DC constant low voltage level in a high voltage level period of the second clock driving signal.

6. The GOA circuit based on LTPS semiconductor TFT according to claim 3, wherein a signal output waveform of the first node changes according to the variation of the waveform duty ratios of the first clock driving signal and the second clock driving signal.

7. The GOA circuit based on LTPS semiconductor TFT according to claim 6, wherein a signal output waveform of the first node appears to be convex.

8. The GOA circuit based on LTPS semiconductor TFT according to claim 1, wherein in the first level connection of the GOA circuit, both the gate and the drain of the first transistor are electrically coupled to an activation signal end of the circuit.

9. A GOA circuit based on LTPS semiconductor TFT, comprising a plurality of GOA units which are cascade connected, and N is set to be a positive integer and an Nth GOA unit comprises a pull-up control part, a pull-up part, a first pull-down part, a pull-down holding part and a transfer part;
the pull-up control part comprises a first transistor, and a gate is electrically coupled to an driving output end of an N−1th GOA unit which is the former stage of the Nth GOA unit and a source is electrically coupled to an output end of an N−1th GOA unit which is the former stage of the Nth GOA unit, and a drain is electrically coupled to a first node;
the pull-up part comprises a second transistor, and a gate of the second transistor is electrically coupled to the first node, and a source is electrically coupled to a first clock driving signal, and a drain is electrically coupled to an output end;
the pull-down holding part is electrically coupled to the first node, the output end, a DC constant high voltage level, and a first, a second and a third DC constant low voltage levels;
the pull-down holding part utilizes a high/low voltage reverse design and comprises:
a third transistor, and both a gate and a source of the third transistor are electrically coupled to the DC constant high voltage level, and a drain is electrically coupled to a source of a fifth transistor;
a fourth transistor, and a gate of the fourth transistor is electrically coupled to the drain of the third transistor, and a source is electrically coupled to the DC constant high voltage level, and a drain is electrically coupled to a second node;
the fifth transistor, and a gate of the fifth transistor is electrically coupled to the first node, and the source is electrically coupled to the drain of the third transistor, and a drain is electrically coupled to the first DC constant low voltage level;
a sixth transistor, and a gate of the sixth transistor is electrically coupled to the first node, and a source is electrically coupled to the second node, and a drain is electrically coupled to a source of an eighth transistor;
the eighth transistor, and the gate of the eighth transistor is electrically coupled to the first node, and the source is electrically coupled to the drain of the sixth transistor, and a drain is electrically coupled to the third DC constant low voltage level;
the tenth transistor, and the gate of the tenth transistor is electrically coupled to the second node and a source is electrically coupled to the DC constant high voltage level, and a drain is electrically coupled to the drain of the sixth transistor;
a twelfth transistor, and a gate of the twelfth transistor is electrically coupled to the second node, and a source is electrically coupled to the first node, and a drain is electrically coupled to the second DC constant low voltage level;
a thirteenth transistor, and a gate of the thirteenth transistor is electrically coupled to the second node, and a source is electrically coupled to the output end, and a drain is electrically coupled to the first DC constant low voltage level;
the third transistor, the fourth transistor, the fifth transistor, the sixth transistor provide positive high voltage levels, employed to control activations of the twelfth transistor and the thirteenth transistor; the eighth transistor constructs a reverse bootstrap of negative voltage level in a functioning period, employed to provide a lower voltage level to the second node in the functioning period; the DC constant high voltage level is utilized to provide a proper high voltage level to the second node in a non-functioning period to maintain the first node and the output end at low voltage level;
the first pull-down part is electrically coupled to the first node, a second clock driving signal and the second DC constant low voltage level, and the pull-down part pulls down a voltage level of the first node to the second DC constant low voltage level according to the second clock driving signal;
the first pull-down part comprises a fourteenth transistor, and a gate of the fourteenth transistor is electrically coupled to the second clock driving signal, and a source is electrically coupled to the first node, and a drain is electrically coupled to the second DC constant low voltage level;
the transfer part comprises a fifteenth transistor, and a gate of the fifteenth transistor is electrically coupled to the first node, and a source is electrically coupled to the first clock driving signal, and a drain is electrically coupled to a driving output end;
the third DC constant low voltage level<the second DC constant low voltage level<the first DC constant low voltage level;
the GOA circuit further comprises a boost part, and the boost part is electrically coupled between the first node and the output end, employed to boost voltage level of the first node;
wherein the boost part comprises a capacitor, and one end of the capacitor is electrically coupled to the first node, and the other end is electrically coupled to the output end;
wherein waveform duty ratios of the first clock driving signal and the second clock driving signal are smaller than 50/50; the fourteenth transistor pulls down the voltage level of the first node to the second DC constant low voltage level in a high voltage level period of the second clock driving signal;

wherein a signal output waveform of the first node appears to be convex.

* * * * *